(12) United States Patent
Chen

(10) Patent No.: US 7,359,203 B2
(45) Date of Patent: Apr. 15, 2008

(54) COMBINATION OF INVERTER CASING AND HEAT SINK MEMBER

(75) Inventor: Wei-Kuang Chen, Pateh (TW)

(73) Assignee: Cotek Electronic Ind. Co. Ltd, Taoyuan (TW)

( * ) Notice: Subject to any disclaimer, the term of this patent is extended or adjusted under 35 U.S.C. 154(b) by 102 days.

(21) Appl. No.: 11/493,660

(22) Filed: Jul. 27, 2006

(65) Prior Publication Data

US 2007/0025087 A1    Feb. 1, 2007

(30) Foreign Application Priority Data

Jul. 27, 2005    (CN) .................. 2005 1 0083476

(51) Int. Cl.
*H05K 7/20* (2006.01)
(52) U.S. Cl. ............. 361/714; 361/704; 361/707; 361/622; 361/625; 174/50
(58) Field of Classification Search ............ 361/704, 361/622, 624–627, 707–710, 679, 687, 714–721, 361/728, 730, 744, 752, 756, 807, 809; 174/50, 174/50.54, 52.1, 523; 165/80.3, 185; 312/223.2, 312/223.3
See application file for complete search history.

(56) References Cited

U.S. PATENT DOCUMENTS

| | | | | |
|---|---|---|---|---|
| 4,656,559 A | * | 4/1987 | Fathi | 361/721 |
| 4,791,531 A | * | 12/1988 | Jessup | 361/736 |
| 5,461,542 A | * | 10/1995 | Kosak et al. | 361/710 |
| 5,521,792 A | * | 5/1996 | Pleitz et al. | 361/715 |
| 5,742,478 A | * | 4/1998 | Wu | 361/704 |
| 5,903,435 A | * | 5/1999 | Hsieh et al. | 361/704 |
| 6,046,908 A | * | 4/2000 | Feng | 361/707 |
| 6,411,514 B1 | * | 6/2002 | Hussaini | 361/704 |
| 6,542,368 B2 | * | 4/2003 | Miyazawa | 361/704 |

* cited by examiner

*Primary Examiner*—Michael Datskovskiy

(57) ABSTRACT

The present invention provides an inverter assembly which comprises a casing with a top part, a base and two sidewalls, and the top part. The base and the two sidewalls are integrally manufactured as a one-piece. A printed circuit board with a plurality of electronic parts is received in the casing. A heat sink member has a guide member and a body, wherein the guide member is slidably engaged with a groove defined in an inside of either of the two sidewalls is able to be pivoted about the guide member in a limited angle so as to adjust a gap between the inside of the sidewall and an inside of the heat sink member. The electronic part is clamped between the inside of the sidewall and an inside of the heat sink member. The front and rear sides of the electronic part are in contact with the heat sink member and the sidewall so as to efficiently dispense the heat.

22 Claims, 6 Drawing Sheets

COMBINATION OF INVERTER CASING AND HEAT SINK MEMBER

BACKGROUND OF THE PRESENT INVENTION

1. Field of Invention

The present invention relates to a casing of a power supply with at least one heat sink element, and more particularly to a casing of a DC/AC inverter with at least one heat sink element in which at least one electronic part is positioned and in contact with both the sidewall of the casing and the heat sink member so as to efficiently dispense heat from the electronic part.

2. Description of Related Arts

Please refer to FIG. 1, which is a schematic diagram of a conventional casing of a DC/AC inverter 100. As shown in FIG. 1, the conventional casing of the DC/AC inverter 100 generally comprises a top part 110 and a base 120 which is an individual part from the top part 110. A printed circuit board (PCB) 160 is positioned inside the conventional casing of the DC/AC inverter 100. The printed circuit board (PCB) 160 is positioned onto the base 120 by extending bolts through the printed circuit board 160 in the casing 100 and is threadedly engaged with threaded holes in the inside 120A of the base 120.

The electronic parts 130a, 130B such as transistors are positioned in the casing 100 by extending bolts 150A, 150B through holes in two sidewalls 120A, 120B of the base 120 and holes in the electronic parts 130a, 130B and then fixed to the heat sink members 140A, 140B. By this way, the electronic parts 130a, 130B are positioned onto the insides of the two sidewalls 120A, 120B by the heat sink members 140A, 140B.

Referring to FIGS. 1, 2A and 2B, the heat sink members 140A, 140B each comprises a nut 141A/141B so as to be connected to the bolts 150A/150B to position the electronic parts 130A, 130B to the sidewalls 120b, 120C of the base 120 of the casing 100.

However, the casing 100 is composed of the top part 110 and the base 120, so that the top part 110 and the base 120 have to be manufactured and coated with proper material in separate, this increases manufacturing cost. Besides, the top part 110 and the base 120 cannot be connected with each other tightly so that electro-magnetic wave might leak therefrom. The heat that the base 120 absorbs cannot be dispensed and sent to the top part 110, which might cause overheat problem during operation. Furthermore, because the top part 110 and the base 120 are proceeded with surface treatment individually, such as electro-plating, so that they might have different colors. In addition, the rear sides of the electronic parts 130A, 130B are in contact with the sidewalls 120B, 120C of the base 120 so as to conduct heat to the sidewalls 120B, 210C. Nevertheless, the heat on the two respective front sides of the electronic parts 130A, 130B lack efficient heat dispensing media to cool the electronic parts 130A, 130B down. The conventional positioning members 140A, 140B are made by iron which is not an efficient heat dispensing material.

SUMMARY OF THE PRESENT INVENTION

The main object of the present invention is to provide a casing of a power supply with at least one heat sink element in which the casing having a top part, a base and two sidewalls. The top part, the base and the two sidewalls are integrally manufactured as a one piece such that the heat from the electronic parts inside the casing can be sent to the casing which has a larger area for dispensing heat. Thus, the casing of the power supply with at least one heat sink element could provide better heat dispensing efficiency.

Another object of the present invention is to provide a casing of a power supply with at least one heat sink element in which the top part, the base and the two sidewalls are integrally manufactured as a one piece. The electronic parts is positioned by a heat sink member, and the front and rear sides of the electronic part are in contact with the casing and the heat sink member, such that heat can be dispensed efficiently.

Another object of the present invention is to provide a casing of a power supply with at least one heat sink element which is manufactured integrally as a one piece so that the manufacturing cost is reduced and the color of the casing is consistent.

Another object of the present invention is to provide a casing of a power supply with at least one heat sink element wherein the casing is manufactured integrally as a one piece by way of aluminum extrusion which improves heat dispensing efficiency and electro-magnetic wave leakage.

Another object of the present invention is to provide a casing of a power supply with at least one heat sink element in which a printed circuit board is received in the casing and a plurality of electronic parts are connected on the printed circuit board. The two sidewalls each have a groove defined in an inside thereof. A heat sink member has a guide member which is slidable engaged with the groove so that the heat sink member can be pivoted about the guide member in a limited angle so as to clamp the heat sink members of different thickness between the inside of the sidewall and an inside of the heat sink member.

Another object of the present invention is to provide a casing of a power supply with at least one heat sink element wherein the electronic part is positioned by an heat sink member which comprises a guide member slidably engaged with a groove in the casing and can be slightly pivoted about the guide member so as to clamp electronic parts of different thickness between the heat sink member and the sidewall of the casing.

Another object of the present invention is to provide a casing of a power supply with at least one heat sink element wherein the heat sink member comprises a body with a plurality of fins for dispensing heat and reinforcing structural strength thereof.

Another object of the present invention is to provide a casing of a power supply with at least one heat sink element wherein the heat sink member comprises a body which includes a certain thickness so that a screw can be directly connected to the body of the heat sink member without a nut.

The present invention will become more obvious from the following description when taken in connection with the accompanying drawings which show, for purposes of illustration only, a preferred embodiment in accordance with the present invention.

Accordingly, in order to accomplish the one or some or all above objects, the present invention provides an inverter assembly comprising:

a casing having a top part, a base and two sidewalls, the top part, the base and the two sidewalls being integrally manufactured as a one piece and having a hollow interior and an open side, a printed circuit board received in the casing via the open side and a plurality of electronic parts connected on the printed circuit board, one of the two sidewalls having a groove defined in an inside thereof, and a heat sink member having a guide member and a body, the guide member slidably engaged with the groove via the open side and the heat sink member being pivoted about the guide member in a limited angle so as to adjust a gap between the inside of the sidewall having the groove and an inside of the heat sink member, the gap adapted to accommodate an electronic part.

One or part or all of these and other features and advantages of the present invention will become readily apparent to those skilled in this art from the following description wherein there is shown and described a preferred embodiment of this invention, simply by way of illustration of one of the modes best suited to carry out the invention. As it will be realized, the invention is capable of different embodiments, and its several details are capable of modifications in various, obvious aspects all without departing from the invention. Accordingly, the drawings and descriptions will be regarded as illustrative in nature and not as restrictive.

DETAILED DESCRIPTION OF THE PREFERRED EMBODIMENT

In the following detailed description of the present invention, numerous specific details are set forth in order to provide a thorough understanding of the present invention. However, it will be obvious to one skilled in the art that the present invention may be practiced without these specific details. In other instances well known methods, procedures, components, and circuits have not been described in detail so as not to unnecessarily obscure aspects of the present invention.

Figure 1:
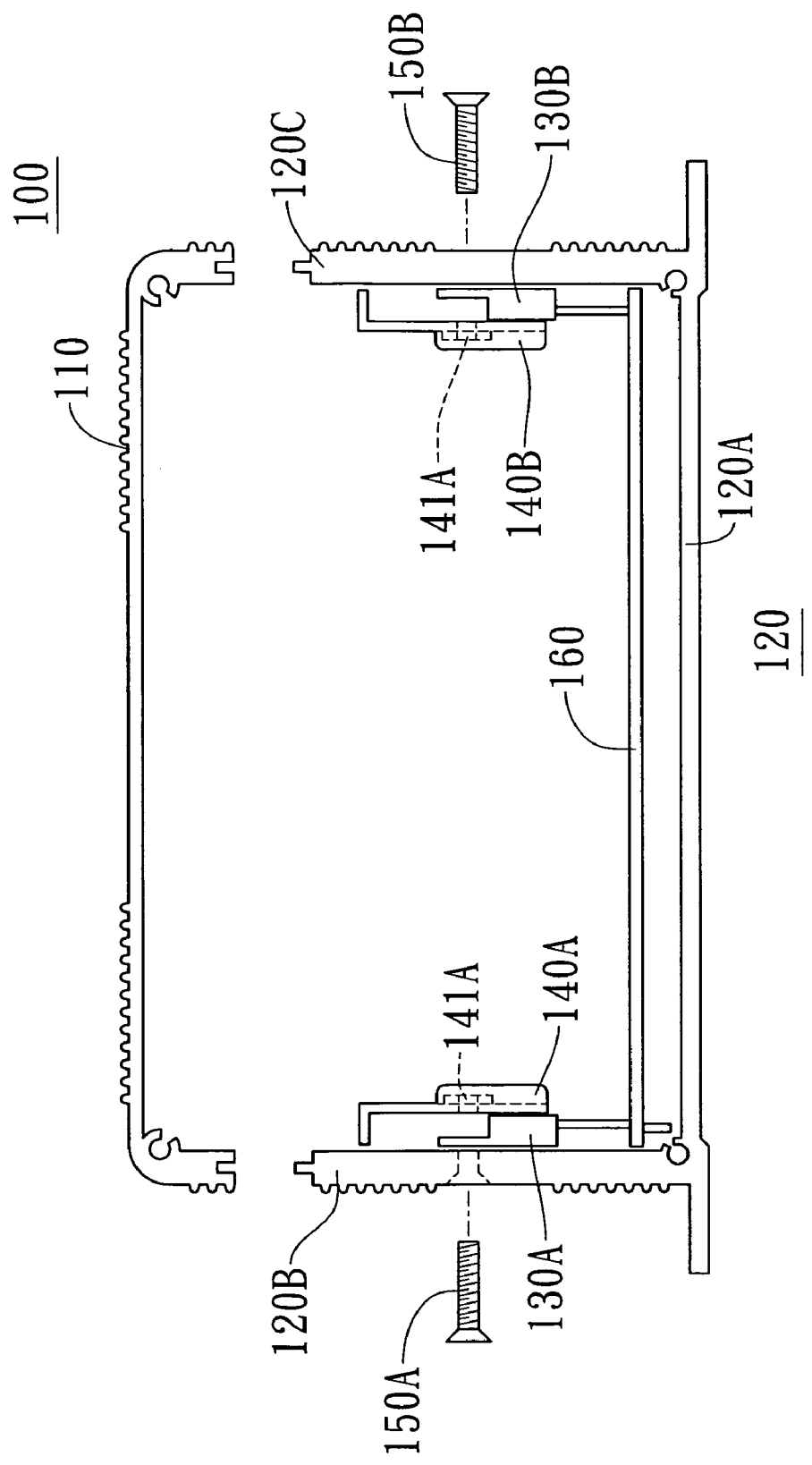
FIG. 1 is a perspective view of a conventional DC/AC inverter.
Figure 2B:
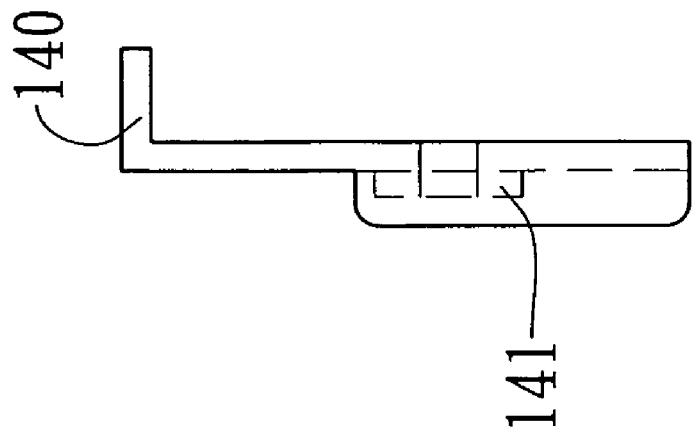
FIGS. 2A, 2B respectively show front and side cross sectional views of the conventional DC/AC inverter.
Figure 2A:
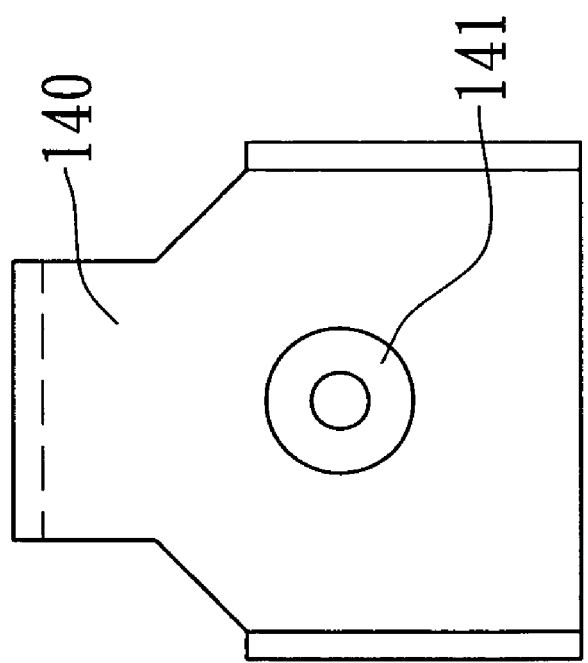
Figure 3:
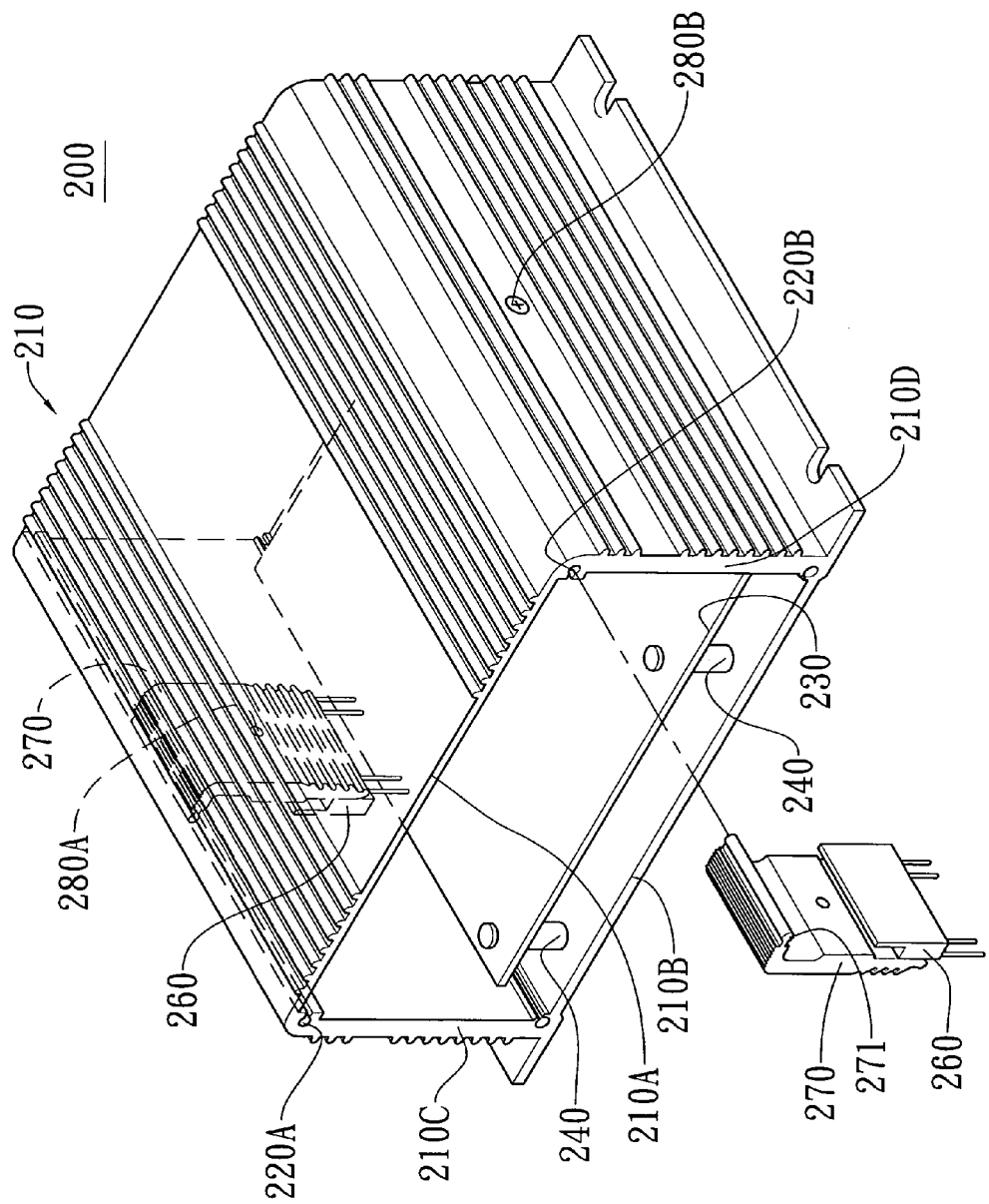
FIG. 3 is a perspective view of the DC/AC inverter of the present invention.
Figures 4A, 4B:
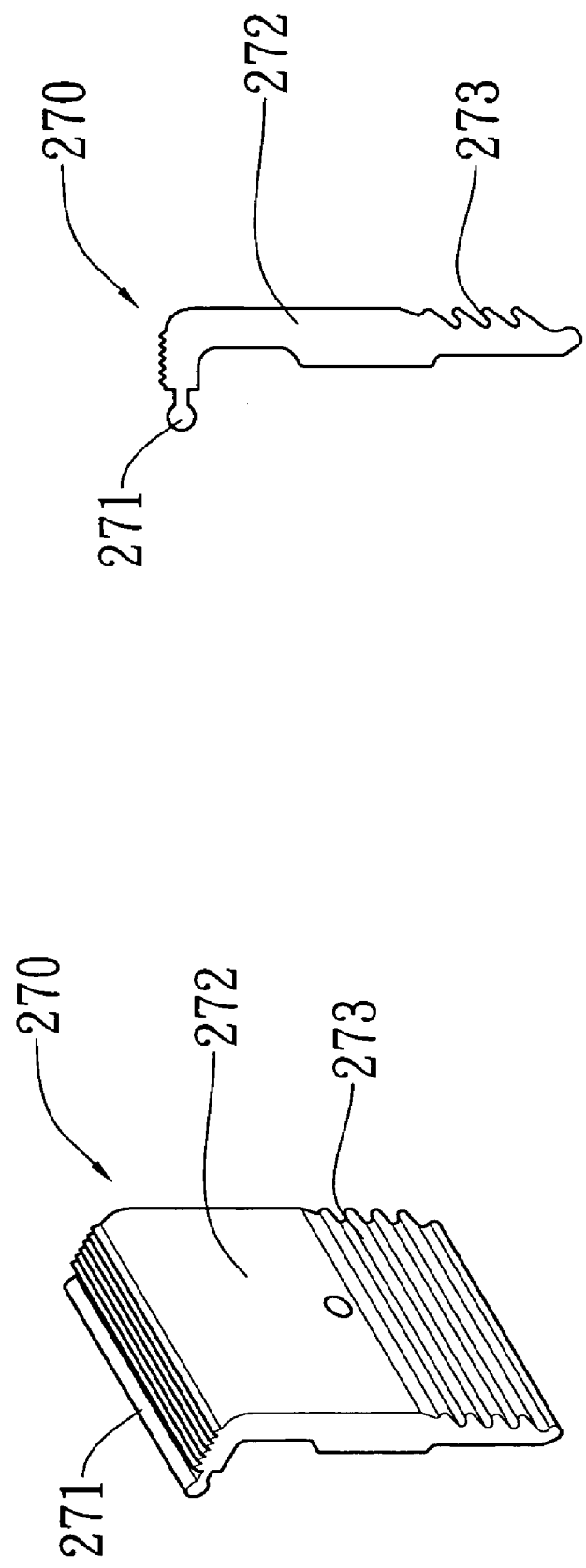
FIGS. 4A, 4B show a perspective view and a side view of the heat sink member of the present invention.

Referring to FIGS. 3, 4A and 4B, the DC/AC inverter 200 of the present invention comprises a casing 210 having a top part 210A, a base 210B and two sidewalls 210C, 210D. The top part 210A, the base 210B and the two sidewalls 210C, 210D are integrally manufactured as a one piece and the casing 210 has a hollow interior and an open side 250. A printed circuit board 230 is received in the casing 210 via the open side 250 and a plurality of electronic parts 260 are connected on the printed circuit board 230. The printed circuit board 230 is positioned by extending bolts 240 through the printed circuit board 230 and connected with holes in the base 210B. Each of the two sidewalls 210C, 210D has a groove 220A/220B defined in an inside thereof.

A heat sink member 270 comprises a guide member 273 which could be a cylindrical rod and a body 272 from which a plurality of fins 273 extend. The guide member 271 is slidably engaged with the groove 220A/220B via the open side 250 and the heat sink member 270 can be pivoted about the guide member 271 in a limited angle so as to adjust a gap between the inside of the sidewall 210C/210D. The electronic part 260 is fixedly positioned between the inside of the heat sink member 270 and the inside of the sidewall 210C/210D. The fins 273 extending from the body 272 reinforce structural strength of the body 272 and increase area for dispensing heat of the electronic parts 260.

The heat sink member 270 is made by way of aluminum extrusion and the thickness of the body 272 allows screws 280A, 280B directly to be threadedly connected to the body 272 without using a nut while the body 272 is not deformed. By this way, the manufacturing cost can be reduced because no threaded holes and nuts are needed. The electronic parts 260 can be IGBT, MOSFET, SCR, diodes or thyristors. It is noted that the front an rear sides are in contact with the heat sink member 270 and the inside of the sidewall 210C/210D so that heat from the electronic part 260 can be efficiently conducted to the casing 210 which has larger area for dispensing the heat.

Figure 5:
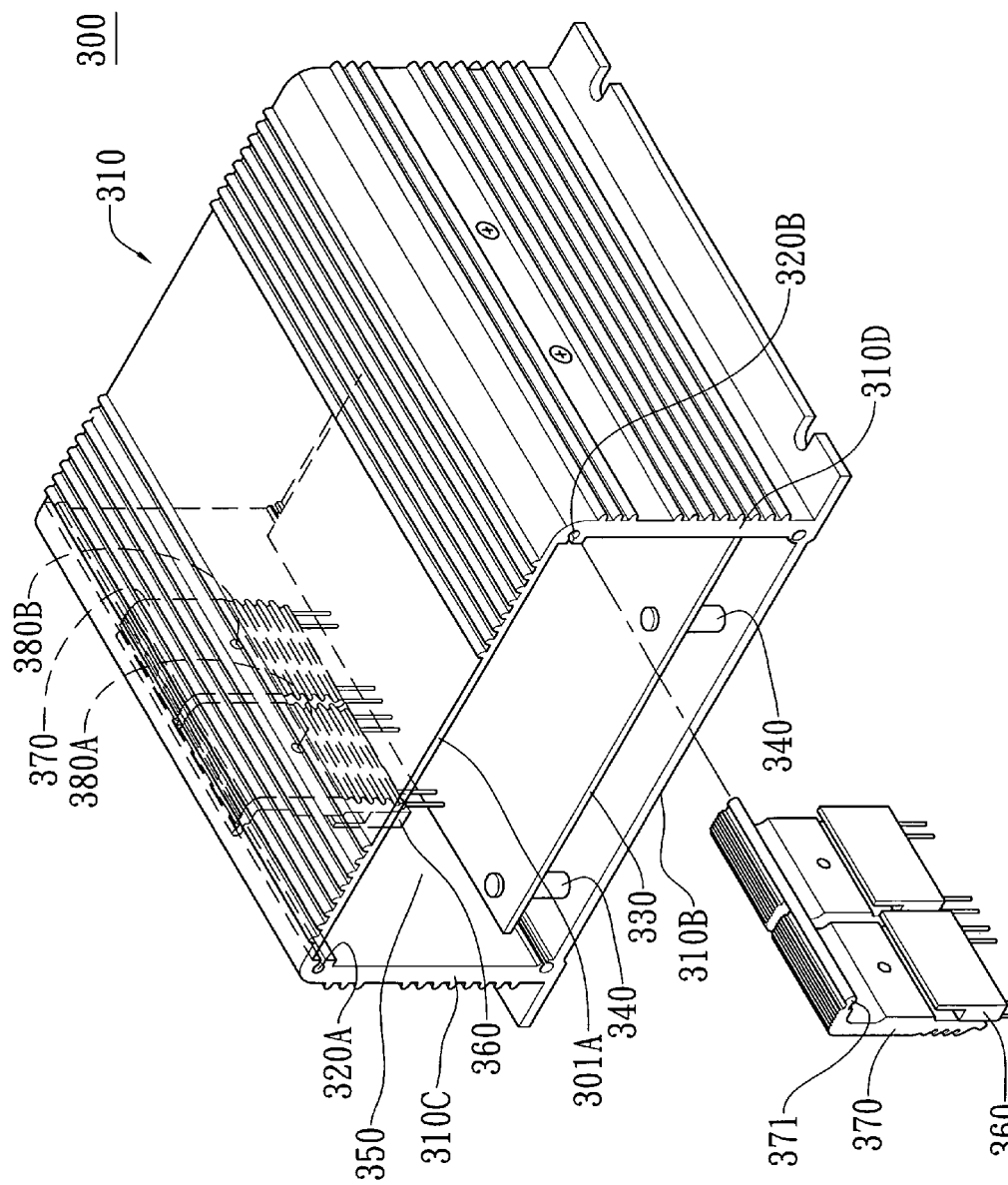
FIG. 5 is a perspective view of another embodiment of the DC/AC inverter of the present invention.
Figure 6B:
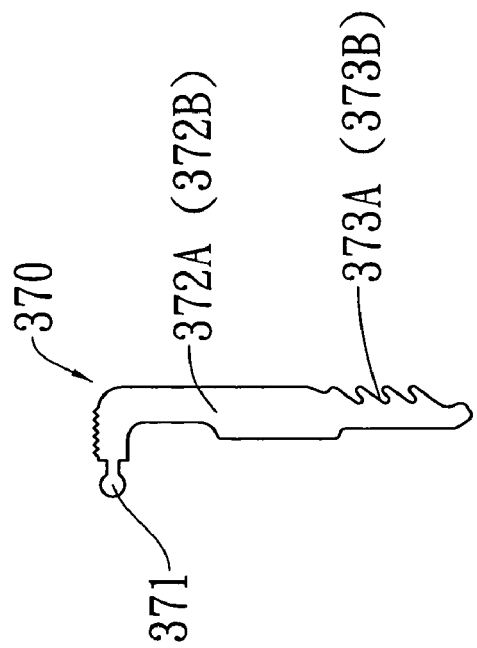
FIGS. 6A, 6B show a perspective view and a side view of the heat sink member of the embodiment in FIG. 5 of the present invention.
Figure 6A:
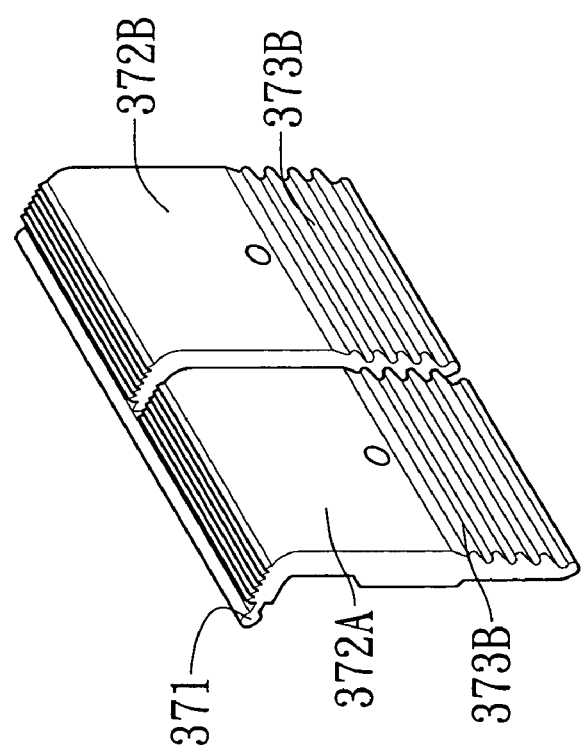

Referring to FIGS. 5, 6A and 6B, another embodiment of the DC/AC inverter 300 of the present invention is disclosed and comprises an casing 310 having a top part 310A, a base 310B and two sidewalls 310C, 310D. The top part 310A, the base 310B and the two sidewalls 310C, 310D are integrally manufactured as a one piece and the casing 310 has a hollow interior and an open side 350. A printed circuit board 330 is received in the casing 310 via the open side 350 and a plurality of electronic parts 360 are connected on the printed circuit board 330. The printed circuit board 330 is positioned by extending bolts 340 through the printed circuit board 330 and connected with holes in the base 310B. Each of the two sidewalls 310C, 310D has a groove 320A/320B defined in an inside thereof.

A heat sink member 370 comprises a guide member 373 which could be a cylindrical rod and two bodies 372 from which a plurality of fins 373A/373B extend. The guide member 371 is slidably engaged with the groove 320A/320B via the open side 350 and the heat sink member 370 can be pivoted about the guide member 371 in a limited angle so as to adjust a gap between the inside of the sidewall 310/310D. The electronic part 360 is fixedly positioned between the inside of the heat sink member 370 and the inside of the sidewall 310C/310D. The fins 373 extending from the body 372 reinforce structural strength of the body 372 and increase area for dispensing heat of the electronic parts 360.

The heat sink member 370 is made by way of aluminum extrusion and the thickness of the bodies 372 allows screws 380A, 380B directly to be threadedly connected to the bodies 372 without using a nut while the bodies 372 are not deformed. By this way, the manufacturing cost can be reduced because no threaded holes and nuts are needed. The electronic parts 260 can be IGBT, MOSFET, SCR, diodes or thyristors. It is noted that the front an rear sides are in contact with the heat sink member 370 and the inside of the sidewall 310C/310D so that heat from the electronic part 360 can be efficiently conducted to the casing 310 which has larger area for dispensing the heat.

The casing of the present invention is an integral casing so that the area for dispensing heat is sufficient and the manufacturing cost can be reduced and the color of the casing is consistent. The front and rear sides of the electronic part are in contact with the casing and the heat sink member so that the heat from the electronic part can be dispensed efficiently. The casing is made by way of aluminum extrusion which improves heat dispensing efficiency and electromagnetic wave leakage.

One skilled in the art will understand that the embodiment of the present invention as shown in the drawings and described above is exemplary only and not intended to be limiting.

The foregoing description of the preferred embodiment of the present invention has been presented for purposes of illustration and description. It is not intended to be exhaustive or to limit the invention to the precise form or to exemplary embodiments disclosed. Accordingly, the foregoing description should be regarded as illustrative rather than restrictive. Obviously, many modifications and variations will be apparent to practitioners skilled in this art. The embodiments are chosen and described in order to best explain the principles of the invention and its best mode practical application, thereby to enable persons skilled in the art to understand the invention for various embodiments and with various modifications as are suited to the particular use or implementation contemplated. It is intended that the scope of the invention be defined by the claims appended hereto and their equivalents in which all terms are meant in their broadest reasonable sense unless otherwise indicated. It should be appreciated that variations may be made in the embodiments described by persons skilled in the art without departing from the scope of the present invention as defined by the following claims. Moreover, no element and component in the present disclosure is intended to be dedicated to the public regardless of whether the element or component is explicitly recited in the following claims.

What is claimed is:

1. An inverter assembly comprising:
    a casing having a top part, a base and two sidewalls, said top part, said base and said two sidewalls being integrally manufactured as a one piece and having a hollow interior and an open side, a printed circuit board received in said casing via said open side and a plurality of electronic parts connected on said printed circuit board, one of said two sidewalls having a groove defined in an inside thereof, and
    a heat sink member having a guide member and a body, said guide member slidably engaged with said groove via said open side and said heat sink member being pivoted about said guide member in a limited angle so as to adjust a gap between said inside of said sidewall having said groove and an inside of said heat sink member, said gap adapted to accommodate an electronic part.

2. The assembly as claimed in claim 1, wherein said casing is made by way of aluminum extrusion.

3. The assembly as claimed in claim 1, wherein said heat sink member is made by way of aluminum extrusion.

4. The assembly as claimed in claim 2, wherein said heat sink member is made by way of aluminum extrusion.

5. The assembly as claimed in claim 1, wherein said heat sink member includes a plurality fins extending from said body thereof so as to reinforce structural strength and to increase area for dispensing heat.

6. The assembly as claimed in claim 3, wherein said heat sink member includes a plurality fins extending from said body thereof so as to reinforce structural strength and to increase area for dispensing heat.

7. The assembly as claimed in claim 4, wherein said heat sink member includes a plurality fins extending from said body thereof so as to reinforce structural strength and to increase area for dispensing heat.

8. The assembly as claimed in claim 4, wherein said guide member of said heat sink member is a cylindrical rod.

9. The assembly as claimed in claim 5, wherein said guide member of said heat sink member is a cylindrical rod.

10. The assembly as claimed in claim 6, wherein said guide member of said heat sink member is a cylindrical rod.

11. The assembly as claimed in claim 7, wherein said guide member of said heat sink member is a cylindrical rod.

12. An inverter assembly comprising:
    a casing having a top part, a base and two sidewalls, said top part, said base and said two sidewalls being integrally manufactured as a one piece and having a hollow interior and an open side, a printed circuit board received in said casing via said open side and a plurality of electronic parts connected on said printed circuit board, one of said two sidewalls having a groove defined in an inside thereof, and
    a heat sink member having a guide member and a body, said guide member slidably engaged with said groove via said open side and said heat sink member being pivoted about said guide member in a limited angle so as to adjust a gap between said inside of said sidewall having said groove and an inside of said heat sink member, said gap adapted to accommodate an electronic part.

13. The assembly as claimed in claim 12, wherein said casing is made by way of aluminum extrusion.

14. The assembly as claimed in claim 12, wherein said heat sink member is made by way of aluminum extrusion.

15. The assembly as claimed in claim 13, wherein said heat sink member is made by way of aluminum extrusion.

16. The assembly as claimed in claim 12, wherein said heat sink member includes a plurality fins extending from said body thereof so as to reinforce structural strength and to increase area for dispensing heat.

17. The assembly as claimed in claim 14, wherein said heat sink member includes a plurality fins extending from said body thereof so as to reinforce structural strength and to increase area for dispensing heat.

18. The assembly as claimed in claim 15, wherein said heat sink member includes a plurality fins extending from said body thereof so as to reinforce structural strength and to increase area for dispensing heat.

19. The assembly as claimed in claim 12, wherein said guide member of said heat sink member is a cylindrical rod.

20. The assembly as claimed in claim 16, wherein said guide member of said heat sink member is a cylindrical rod.

21. The assembly as claimed in claim 17, wherein said guide member of said heat sink member is a cylindrical rod.

22. The assembly as claimed in claim 18, wherein said guide member of said heat sink member is a cylindrical rod.

* * * * *